(12) United States Patent
Hautson et al.

(10) Patent No.: US 9,703,001 B2
(45) Date of Patent: Jul. 11, 2017

(54) METHOD FOR AUTOMATIC RECOGNITION OF A MOBILE MAGNETIC OBJECT

(71) Applicant: Commissariat à l'énergie atomique et aux énergies alternatives, Paris (FR)

(72) Inventors: Tristan Hautson, Fontaine (FR); Rabeb Aloui, Fontaine (FR); Saifeddine Aloui, Grenoble (FR); Timothée Jobert, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 27 days.

(21) Appl. No.: 14/443,755

(22) PCT Filed: Nov. 12, 2013

(86) PCT No.: PCT/EP2013/073656
§ 371 (c)(1),
(2) Date: May 19, 2015

(87) PCT Pub. No.: WO2014/079740
PCT Pub. Date: May 30, 2014

(65) Prior Publication Data
US 2015/0301216 A1    Oct. 22, 2015

(30) Foreign Application Priority Data

Nov. 20, 2012 (FR) .................. 12 61044

(51) Int. Cl.
*G01V 3/08*     (2006.01)
*G01R 33/00*    (2006.01)

(52) U.S. Cl.
CPC ......... *G01V 3/081* (2013.01); *G01R 33/0094* (2013.01)

(58) Field of Classification Search
None
See application file for complete search history.

(56) References Cited

U.S. PATENT DOCUMENTS

| | | | | |
|---|---|---|---|---|
| 4,837,489 A | * | 6/1989 | McFee | G01V 3/081 324/207.26 |
| 4,885,536 A | * | 12/1989 | Blanpain | G01V 3/081 324/207.13 |

(Continued)

FOREIGN PATENT DOCUMENTS

GB        2310930        9/1997

*Primary Examiner* — Jermele M Hollington
*Assistant Examiner* — Suresh K Rajaputra
(74) *Attorney, Agent, or Firm* — Occhiuti & Rohlicek LLP

(57) ABSTRACT

An automatic recognition method includes the calculation of an error representative of the difference between an estimate of the values of the magnetometer measurements when the positions, orientations and amplitudes of the magnetic moments of the P dipoles are equal to those determined, and the values of the magnetometer measurements taken. There is the selection of another system of equations linking each measurement of a triaxial magnetometer to the position, orientation and amplitude of the magnetic moment of P' magnetic dipoles. The method includes the calculation of at least one distinctive feature of the object presented from the position, orientation, or amplitude of the magnetic moment of each dipole determined with the system of equations that minimizes the error calculated. The method includes the recognition of the magnetic object presented if the calculated distinctive features correspond to those of a known object, otherwise the lack of recognition of this object.

7 Claims, 2 Drawing Sheets

(56) References Cited

U.S. PATENT DOCUMENTS

| | | | | |
|---|---|---|---|---|
| 5,134,369 | A * | 7/1992 | Lo | G01V 3/081 324/202 |
| 5,337,259 | A * | 8/1994 | Breed | G01B 7/004 324/207.13 |
| 5,444,669 | A * | 8/1995 | Polvani | F41G 7/008 114/21.3 |
| 5,684,396 | A * | 11/1997 | Aks | G01V 3/081 324/207.13 |
| 5,731,996 | A * | 3/1998 | Gilbert | G01V 3/081 324/207.13 |
| 5,831,873 | A * | 11/1998 | Kohnen | G01V 3/08 701/408 |
| 6,263,230 | B1 * | 7/2001 | Haynor | A61B 5/062 128/899 |
| 6,269,324 | B1 * | 7/2001 | Rakijas | G01V 3/081 324/207.11 |
| 6,539,327 | B1 * | 3/2003 | Dassot | G01V 3/081 702/150 |
| 6,841,994 | B1 * | 1/2005 | Wiegert | G01V 3/15 324/244 |
| 6,888,353 | B1 * | 5/2005 | Wiegert | G01V 3/15 324/244 |
| 7,038,458 | B1 * | 5/2006 | Wiegert | G01V 3/165 324/244 |
| 7,603,251 | B1 * | 10/2009 | Wiegert | G01V 3/081 702/152 |
| 7,633,518 | B2 * | 12/2009 | Beevor | G01V 11/00 348/143 |
| 7,932,718 | B1 * | 4/2011 | Wiegert | G01V 3/081 324/245 |
| 2007/0276218 | A1 | 11/2007 | Yellen | |
| 2009/0070063 | A1 * | 3/2009 | Edelstein | G01V 3/081 702/150 |

* cited by examiner

US 9,703,001 B2

METHOD FOR AUTOMATIC RECOGNITION OF A MOBILE MAGNETIC OBJECT

RELATED APPLICATIONS

This application is a U.S. National Stage of international application number PCT/EP2013/073656, filed Nov. 12, 2013, which claims the benefit of the priority date of French Patent Application FR 1261044, filed Nov. 20, 2012, the contents of which are herein incorporated by reference.

FIELD OF INVENTION

The invention relates to a method and apparatus for automatic recognition of a mobile magnetic object. The invention also relates to an information recording medium for the implementation of this method and a system of identification comprising the automatic recognition apparatus.

BACKGROUND

Here, 'magnetic object' refers to an object comprising components or parts made of a magnetic material. A magnetic material is a material which has magnetic properties measurable by an automatic magnetic object recognition apparatus.

'Mobile' refers to an object that can be moved. Thus, the mobile magnetic object is not always presented in the same position in front of the recognition apparatus. But the magnetic field measured by each magnetometer in the array depends on the position and orientation of the magnetic object presented. Thus, it is very difficult to reliably recognize the magnetic signature of a mobile magnetic object. Until now this problem has been circumvented, e.g. by attaching RFID (Radio Frequency Identification) tags on the magnetic object or by imposing a displacement of the magnetic object along a predetermined path so that it can be recognized.

The prior art is also known from GB2310930A, U.S. Pat. No. 7,932,718B1, U.S. Pat. No. 6,263,230B1, US2007/276218A1, U.S. Pat. No. 5,444,669A, U.S. Pat. No. 5,337,259A and U.S. Pat. No. 5,831,873A.

SUMMARY OF INVENTION

The invention provides another solution exploiting the fact that the object is magnetic. The subject matter of the invention is therefore a method for automatic recognition of a mobile magnetic object according to claim 1.

In the above method, the distinctive features calculated from the measurements of the magnetometers in the array are independent of the position and orientation of the magnetic object with respect to the magnetometer array. Thus, the magnetic object can be recognized regardless of its position with respect to the magnetometer array. The magnetic object can also be recognized even if it moves in front of the magnetometer array.

In addition, systems of equations for determining the position, orientation, and amplitude of the magnetic moment of a plurality of magnetic dipoles present within the same magnetic object, can be used to significantly increase the number of magnetic objects that can be recognized as well as the reliability of recognition of each of these objects.

Finally, the fact of selecting, according to the object presented, the system of equations for minimizing error, enables the reliability of the method to be increased and also enables the number of magnetic dipoles present inside the magnetic object to be counted.

The embodiments of this method may comprise one or more of the features of the dependent claims.

These embodiments of the recognition method further offer the following advantages:

an algorithm for estimating solutions of a nonlinear system of equations can be used to increase the reliability of the method.

The subject matter of the invention is also an information recording medium comprising instructions for the implementation of steps c) through g) of the method above, when these instructions are executed by an electronic computer.

The subject matter of the invention is also an apparatus for automatic recognition of a mobile magnetic object according to claim 5.

Finally, the subject matter of the invention is also a system of identification according to claim 6.

The invention will be better understood on reading the description that follows, given solely by way of a non-restrictive example and referring to the drawings.

DETAILED DESCRIPTION

In the figures, the same references are used for designating the same elements.

In the remainder of this description, features and functions well known to the person skilled in the art are not described in detail.

Figure 1:
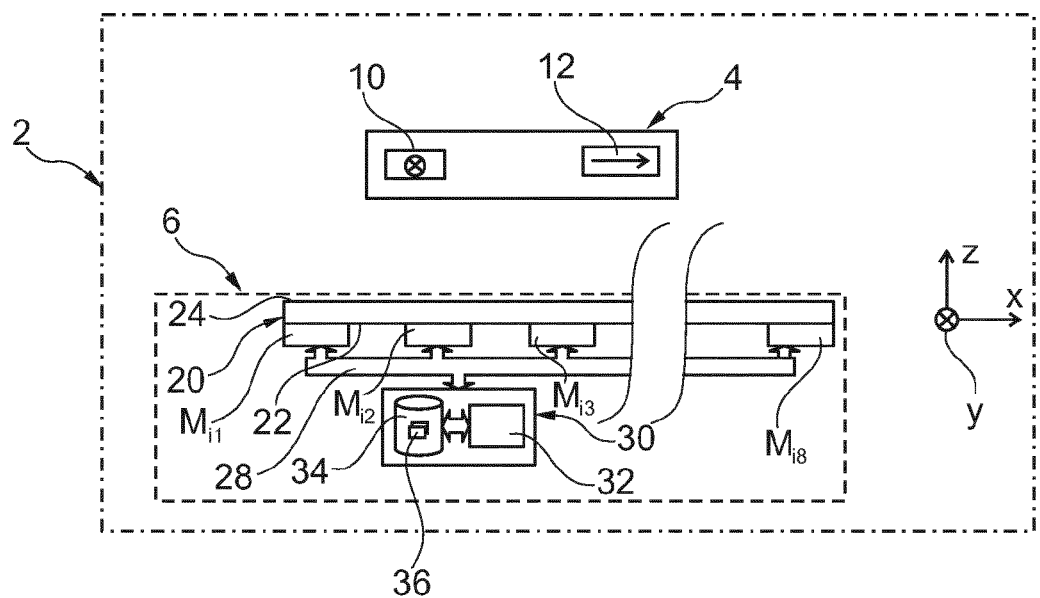
FIG. 1 is a schematic illustration of a system of identification comprising an object to be recognized and an apparatus for automatic recognition of magnetic objects.

FIG. 1 represents a system 2 of identification. The system 2 comprises a magnetic object 4 to be recognized and an apparatus 6 for automatic recognition of magnetic objects.

The object 4 is freely movable in an X, Y, Z orthogonal reference frame fixed without any degree of freedom to the apparatus 6. Here, the X and Y directions are horizontal and the Z direction is vertical.

Typically, the object 4 is freely movable directly by the hand of a human being in the X, Y, Z reference frame. For this purpose, the object 4 generally weighs less than 10 kg, and preferably less than 1 kg or 250 g. For example, the dimensions of the object 4 are sufficiently small so that it can be gripped and moved with one hand by a user.

The object 4 comprises one or more measurable magnetic dipoles. Each magnetic dipole corresponds to a component made of ferromagnetic or ferrimagnetic material that modifies the lines of the Earth's magnetic field. Preferably, this component is a permanent magnet. A permanent magnet presents a non-zero magnetic moment even in the absence of an external magnetic field. For example, the permanent magnet is made of a magnetic material the coercive magnetic field of which is greater than 100 A·m$^{-1}$ or 500 A·m$^{-1}$. Preferably, the power of this permanent magnet is greater than 0.01 A·m$^2$ or 0.1 A·m$^2$.

It is also preferable that the ratio between the powers of the permanent magnets, respectively, the strongest and the weakest of the object is less than ten or five and, advantageously, less than two or 1.5 or equal to one. Indeed, it has been found that this facilitates the recognition of the object 4. Preferably also, the number of magnetic dipoles contained in the object 4 is greater than or equal to two or four for increasing the number of recognizable objects. But a single dipole per object is also possible since in this case the accuracy in measuring the amplitude of the magnetic moment is at the maximum which increases the reliability of recognition.

The magnetic dipoles of the object 4 are immobile with respect to each other in the object 4. For example, they are fixed without any degree of freedom to a frame of the object 4. For example, this frame is made of non-magnetic material. A non-magnetic material does not display any magnetic property that is measurable by the apparatus 6. Given that the magnetic dipoles are fixed in the object 4, the relative distances between these dipoles and the angles between the magnetic moments of these dipoles are constant. Similarly, in this embodiment, the amplitude and the number of magnetic dipoles inside the object 4 are assumed constant.

In order to simplify FIG. 1, only two magnetic dipoles 10 and 12 have been represented in the object 4.

The object 4 is, for example, a portable phone, a portable computer, a pencil provided with a plurality of permanent magnets or any other object comprising one or more magnetic dipoles. In the case of a portable phone, the two magnetic dipoles are formed, respectively, by the phone's microphone and loudspeaker. Indeed, these components comprise permanent magnets.

The apparatus 6 can be used to locate the magnetic dipoles of the object 4 in the XYZ reference frame. Location refers here to determining the position $x_k$, $y_k$, $z_k$ of each dipole in the XYZ reference frame and also to determining the orientation of the magnetic moment of each of the magnetic dipoles with respect to the X, Y and Z axes of the XYZ reference frame, where the index k identifies the magnetic dipole among all the magnetic dipoles of the object 4. For example, the orientation of the magnetic dipole k, expressed in spherical coordinates, is represented by angles $\theta_k$ and $\phi_k$ of the magnetic moment of this dipole.

The apparatus 6 comprises an array of N triaxial magnetometers $M_{ij}$. In FIG. 1, the vertical wavy lines indicate that a portion of the apparatus 6 has not been represented.

Typically, N is greater than five and, preferably, greater than sixteen or thirty-two. Here, N is greater than or equal to sixty-four.

In this embodiment, the magnetometers $M_{ij}$ are aligned in rows and columns to form a matrix. Here, this matrix comprises eight rows and eight columns. The indices i and j identify, respectively, the row and column of this matrix at the intersection of which the magnetometer $M_{ij}$ is located. In FIG. 1, only the magnetometers $M_{i1}$, $M_{i2}$, $M_{i3}$, $M_{i4}$ and $M_{i8}$ of a row i are visible. The position of the magnetometers $M_{ij}$ with respect to each other is described in more detail with reference to FIG. 2.

Each magnetometer $M_{ij}$ is fixed without any degree of freedom to the other magnetometers. For this purpose, the magnetometers $M_{ij}$ are fixed without any degree of freedom on a rear face 22 of a rigid plate 20. This rigid plate has a front face 24 facing toward the object 4. The plate 20 is made of a rigid non-magnetic material. For example, the plate 20 is made of glass.

Each magnetometer $M_{ij}$ measures the direction and amplitude of the magnetic field disturbed by the object 4. For this, each magnetometer $M_{ij}$ measures the norm of the magnetic field's orthogonal projection at this magnetometer $M_{ij}$ on three measurement axes of this magnetometer. Here, these three measurement axes are orthogonal to each other. For example, the measurement axes of each of the magnetometers $M_{ij}$ are, respectively, parallel to the X, Y and Z axes of the reference frame. The sensitivity of the magnetometer $M_{ij}$ is, for example, 4*10$^{-7}$ T.

Each magnetometer $M_{ij}$ is connected via a bus 28 for transmitting information to a processing unit 30.

Figure 5:
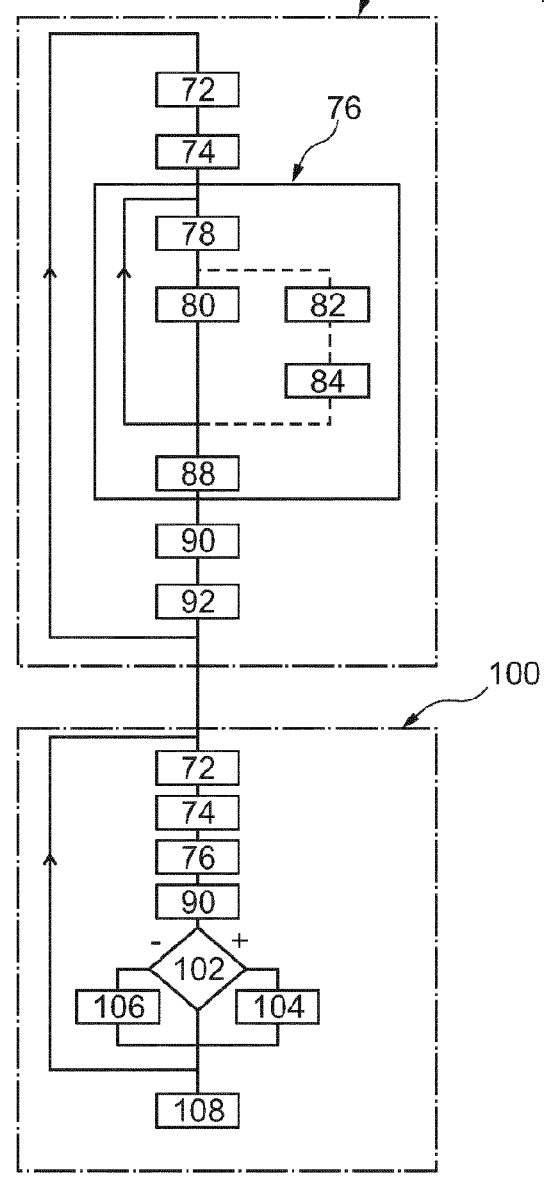
FIG. 5 is a flow chart of a method for automatic recognition of a magnetic object using the system in FIG. 1.

The processing unit 30 is capable of implementing the method of FIG. 5. In particular, it is capable of determining the position and orientation of a plurality of dipoles of the object 4 in the XYZ reference frame from the measurements of the magnetometers $M_{ij}$. For this purpose, the unit 30 comprises a programmable electronic computer 32 capable of executing instructions recorded on an information recording medium. The unit 30 therefore also comprises a memory 34 containing the necessary instructions for the execution by the computer 32 of the method of FIG. 5. In particular, for each number P of magnetic dipoles that may be contained in the same magnetic object, the unit 30 implements a mathematical model $M_P$ associating each measurement of a magnetometer $M_{ij}$ with the positions, orientations and amplitudes of the magnetic moments of P magnetic dipoles in the XYZ reference frame. Each model $M_P$ is in the form of a system of equations in which a first set of variables represents the positions and orientations of the P magnetic dipoles and the amplitudes of the magnetic moments of these dipoles. A second set of variables represents measurements of the magnetometers $M_{ij}$. For obtaining the positions, orientations and amplitudes of the magnetic moments of the P magnetic dipoles, the variables of the first set are the unknowns and the values of the variables of the second set are known. This model is typically constructed from the physical equations of electromagnetism. The parameters of this model are set by the known distances between the magnetometers $M_{ij}$. For constructing this model, each permanent magnet is approximated by a magnetic dipole. This approximation introduces only very few errors if the distance between the permanent magnet and the magnetometer $M_{ij}$ is greater than 2 L, and, preferably, greater than 3 L, where L is the largest dimension of the permanent magnet. Typically, L is less than 20 cm and, preferably, less than 10 or 5 cm.

Here, the model $M_p$ is nonlinear. The unit 30 solves it by implementing an algorithm for estimating the solution thereof. For example, the algorithm used is a Kalman filter known as an 'Unscented Kalman Filter'.

Given that each magnetic dipole is characterized by three variables for determining its position, two variables for determining its orientation and one variable for determining the amplitude of its magnetic moment, the maximum number of magnetic dipoles that can be simultaneously located by the array of N magnetometers is less than N/2. Hence, the value of the number P is less than or equal to N/2 and, preferably, less than N/5 or N/10 or N/20 for having redundant measurements. Redundancy of the measurements can be used to improve the accuracy of locating the dipoles.

In this embodiment, only three mathematical models $M_1$, $M_2$ and $M_3$ are implemented in the unit 30.

The unit 30 is also capable of recognizing the magnetic object presented in front of the apparatus 6 by comparison with a database 36 of magnetic signatures of known objects. This database 36 is described in more detail with reference to FIG. 3.

Figure 2:
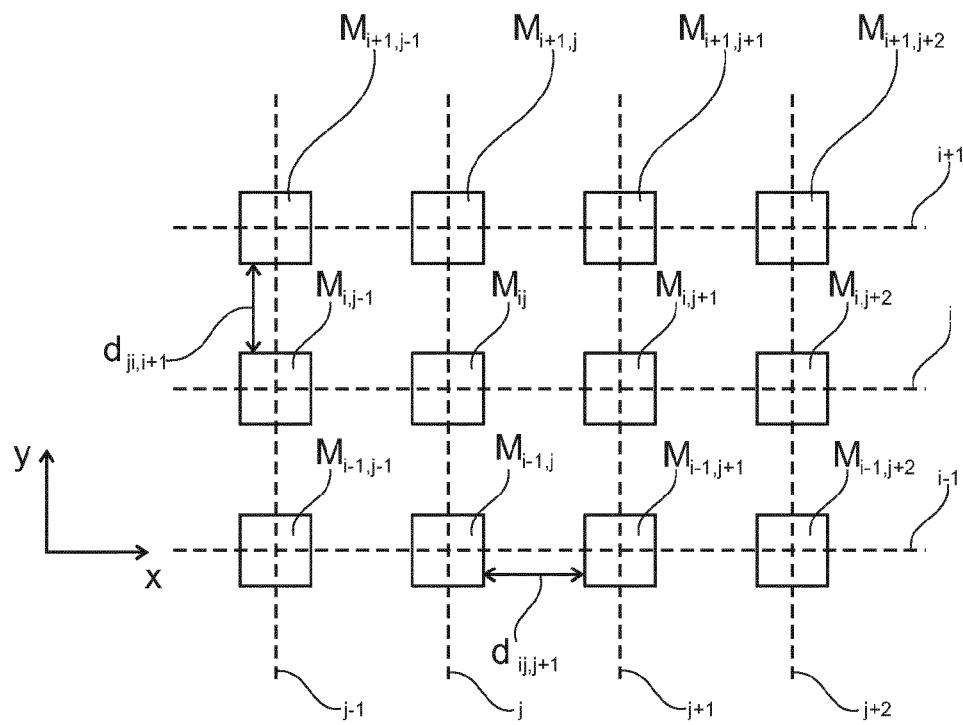
FIG. 2 is a schematic and partial illustration of an array of magnetometers used in the recognition apparatus of the system in FIG. 1.

FIG. 2 represents a portion of the magnetometers $M_{ij}$ of the apparatus 6. These magnetometers $M_{ij}$ are aligned in rows i parallel to the X direction. These magnetometers are also aligned in columns j parallel to the Y direction to form a matrix. The rows i and columns j are arranged in order of increasing indices.

The area occupied by the magnetometer array is typically less than 100 m$^2$ and, preferably, less than 5 m$^2$ or 1 m$^2$ or 50 cm$^2$.

The center of the magnetometer $M_{ij}$ is located at the intersection of row i and column j. The center of the magnetometer is the point where the magnetic field is measured by this magnetometer. Here, the indices i and j belong to the interval [1; 8].

The centers of two immediately consecutive magnetometers $M_{ij}$ and $M_{i,j+1}$ along a row i are separated by a known distance $d_{i,j+1}$. Similarly, the center of two immediately consecutive magnetometers $M_{ij}$ and $M_{i+1,j}$ along the same column j are separated by a known distance $d_{j,i,i+1}$.

In the particular case described here, regardless of the row i, the distance $D_{i,j,j+1}$ is the same. This distance is thus denoted by $d_j$. Similarly, regardless of the column j, the distance $d_{j,i,i+1}$ between two magnetometers is the same. This distance is thus denoted by $d_i$.

Here, the distances $d_i$ and $d_j$ are both equal to d.

Typically, the distance d is between 1 and 4 cm when:
the power of each permanent magnet forming each of the P magnetic dipoles is less than 2 A·m$^2$ or 1 A·m$^2$ or 0.5 A·m$^2$ and, preferably, greater than 0.1 A·m$^2$ or 0.2 A·m$^2$,
the sensitivity of the magnetometers is 4*10$^{-7}$ T, and
the number of magnetometers $M_{ij}$ is sixty-four.

Figure 3:
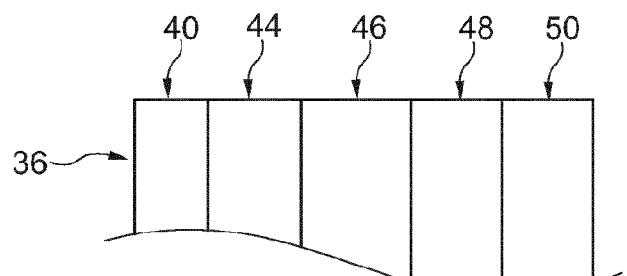
FIG. 3 is a schematic illustration of a database used in the recognition apparatus of the system in FIG. 1.

FIG. 3 represents the database 36 in more detail. This database 36 contains the magnetic signatures of a plurality of known magnetic objects. Here it is represented in the form of a table.

For each known object, the database 36 comprises, in a column 40, an identifier 'm' of this known object. The identifier 'm' uniquely identifies this known object among the set of known objects recorded in the database 36. Each identifier 'm' is associated by the database 36 with a magnetic signature of this known object.

The magnetic signature of an object comprises distinctive features for identifying this object among the set of known objects listed in the database 36.

Here, each known object 'm' is associated with one or more distinctive features selected from the group consisting of:
a number $Ns_m$, of magnetic dipoles contained in the known object 'm',
the relative distances $Ds_m$, between the different magnetic dipoles of the known object 'm',
the amplitudes $As_m$, of the magnetic moments of the different magnetic dipoles of the known object 'm', and
the relative orientations $Os_m$, of the magnetic moments of the different magnetic dipoles of the known object 'm', with respect to each other.

In the above notations, the index 'm' is the identifier of the known object.

The amplitudes of the magnetic moments, the number of magnetic dipoles, the relative distances and the relative orientations are recorded, respectively, in columns 50, 44, 46 and 48 of the database 36. In FIG. 3, the wavy line indicates that only a portion of the database 36 has been represented.

Figure 4:
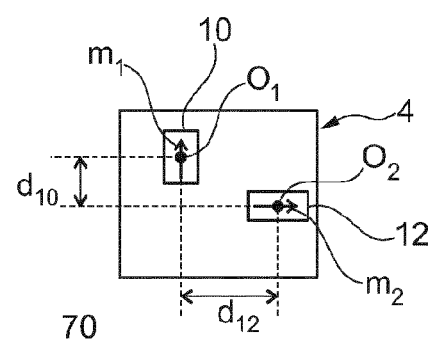
FIG. 4 is a schematic illustration of a top view of the magnetic dipoles of a known magnetic object used in the calibration of the system in FIG. 1.

FIG. 4 illustrates different distinctive features of a known magnetic object. Here, it is assumed that the known magnetic object is identical to the object 4 and that it is identified by the value '1' of the identifier 'm'.

In this FIG. 4, the following notation is used:
$O_1$, $O_2$, the centers, respectively, of the magnetic dipoles 10 and 12,
$m_1$ and $m_2$, the vectors corresponding to the magnetic moments, respectively, of the magnetic dipoles 10 and 12.

Here, it is assumed that the center of the magnetic dipoles coincides with the center of inertia or the center of gravity of the permanent magnet corresponding to this magnetic dipole. The directions of the vectors $m_1$ and $m_2$ are parallel to the magnetic moment, respectively, of the magnetic dipoles 10 and 12. The length of these vectors $m_1$ and $m_2$ is equal to the amplitude of the magnetic moments, respectively, of the magnetic dipoles 10 and 12.

Here, the distinctive features $Ds_1$ are formed by the pair of distances $d_{10}$ and $d_{12}$. $d_{10}$ is equal to the shortest distance between the center $O_1$ and the plane perpendicular to the vector $m_1$ and passing through the center $O_2$. The distance $d_{12}$ is equal to the shortest distance between the center $O_2$ and the plane perpendicular to the vector $m_2$ and passing through the center $O_1$.

The relative orientation $Os_1$ is the angle between the vectors $m_1$ and $m_2$.

The amplitudes $As_1$ are formed by the pair of amplitudes $A_1$ and $A_2$ of the magnetic moments, respectively, of the dipoles 10 and 12.

In the case of the object 4, the number of magnetic dipoles is equal to two.

What has just been described in the particular case where the magnetic object comprises only two magnetic dipoles, is easily applicable to the case of a magnetic object comprising three or more magnetic dipoles.

In the case where the magnetic object comprises a single magnetic dipole, columns 46 and 48 are empty, and the magnetic object can only be recognized from the number of dipoles $Ns_m$ and the amplitude $As_m$ of this magnetic dipole.

The operation of the system 2 will now be described with reference to the method of FIG. 5.

This method begins with a phase 70 of recording the magnetic signatures of a plurality of known magnetic objects in the database 36 and associating an identifier of a known object with each of these signatures.

For this, for example, in a step 72, the known object is placed in front of the face 24. In this step, it is not necessary to position and orient this known object according to a position or a predetermined orientation. On the contrary, the position and orientation of the object may be any whatsoever.

Then, in a step 74, the magnetometers $M_{ij}$ simultaneously measure the magnetic field in the presence of the known object.

Next, in a step 76, the unit 30 determines from the measurements of the magnetometers $M_{ij}$ the position, orientation and amplitude of the magnetic moment of each of the magnetic dipoles of the known object and the number of magnetic dipoles of this known object.

For this, in an operation 78, the unit 30 solves the system of equations of the model $M_1$ for one magnetic dipole. It obtains a set of coordinates $x_1$, $y_1$, $z_1$, $\theta_1$ and $\phi_1$ and an amplitude $A_1$ for the magnetic dipole contained in this known object.

Then, in an operation 80, the unit 30 calculates an error $E_1$ representative of the difference between:
- the estimate of the values measured by the magnetometers, calculated from the system of equations $M_1$ and from the positions, orientations and amplitudes obtained at the conclusion of operation 78, and
- the values of the magnetometer measurements taken in step 74.

In the event that the algorithm used for solving the model is an extended Kalman filter, the solution of this system of equations in operation 78 also provides an estimate of the error $E_1$.

Steps 78 and 80 are performed for P=1 to P=3. Preferably, steps 78 and 80 for each value of P are performed in parallel.

Then, in an operation 88, the unit 30 selects the result obtained with the model $M_P$ which gives the smallest error $E_P$. Thus, if the known object comprises a single permanent magnet, the unit 30 automatically selects the model $M_1$. If the known object comprises two, respectively three, permanent magnets, the unit 30 then automatically selects the model $M_2$, respectively, $M_3$.

At the conclusion of this step 76, the number of magnetic dipoles, the position, orientation and amplitude of each of these magnetic dipoles of the magnetic object are determined.

In a step 90, the unit 30 calculates the distinctive features of the known object from the positions, orientations and amplitudes selected in operation 88. The calculation of these distinctive features is deduced from the explanations given with reference to FIG. 4.

Finally, in a step 92, the unit 30 records in the database 36 the value of the identifier 'm' associated with the different distinctive features calculated in step 90. The different recorded distinctive features then form the magnetic signature of this known object.

Steps 72 through 92 are then repeated for a large number of known objects differing from each other by the position, orientation or amplitude of the magnetic dipoles that they contain.

Once the database 36 has been populated by a plurality of magnetic signatures of known objects, a phase 100 of automatic recognition of an unknown object is implemented. Hereafter, in order to simplify the description, it is assumed that this unknown object is the object 4.

Phase 100 is identical to phase 70 except that step 92 is replaced by steps 102 through 108. Consequently, only these steps 102 through 108 will now be described in detail.

In step 102, the unit 30 compares the distinctive features calculated for the object 4 with the distinctive features contained in each prerecorded magnetic signature in the database 36. For example, it is considered that a measured distinctive feature corresponds to a prerecorded distinctive feature in the database 36 if these distinctive features are equal to within a margin of error c. For example, the margin of error c is equal to plus or minus 1% or plus or minus 5% or plus or minus 10%.

If in step 102, it is established that the object 4 corresponds to one of the magnetic signatures prerecorded in the database 36, then in a step 104, the identifier of the known object corresponding to this signature is recorded. Here, the identifier of the recognized object is recorded in a queue of size Q. Conversely, if in step 102, it is established that the object 4 does not correspond to any of the magnetic signatures recorded in the database 36, then in a step 106, the unit 30 records the information according to which the object 4 has not been recognized. Here, a zero value is recorded in the queue and not an identifier 'm'.

Steps 72 through 106 are repeated Q times. For example, Q is greater than or equal to 10, 20 or 30.

Then, if the same object is recognized in more than 50%, 75% or 95% of the Q iterations of steps 72 through 106, then in a step 108, the unit 30 indicates that the object 4 is recognized and, typically, provides an identifier of the known object. Otherwise, in step 108, the unit 30 indicates that the object 4 has not been recognized. For example, the identifier of the recognized object is communicated to the user via a man-machine interface.

In the presentation of the magnetic object during phase 70 or 100 in front of the face 24, the magnetic object does not need to be immobile. It may move between two successive iterations of the steps of phase 70 or 100. The magnetic object may also be presented in any position and orientation whatsoever. This is due to fact that the distinctive features do not vary according to the position and orientation of the magnetic object. Preferably the object remains close to the sensor array.

Many other embodiments are possible. For example, the magnetometer measurements may be recorded initially. Then, steps 76 through 108 are performed later at a moment when the magnetic object is no longer present in front of the face 24 of the magnetometer array. Likewise, the method in FIG. 5 may be spread over a plurality of electronic computers. For example, steps 90 through 108 are performed by a programmable electronic computer separate from the computer 32 that executes only step 76.

Phase 70 of recording may be performed differently. For example, the distinctive features are calculated from measurements provided by apparatus other than the apparatus 6. For example, the relative distance of the magnetic dipoles can be measured using a ruler then recorded in the database 36. The orientation and amplitude of the magnetic moments of the magnetic dipoles of known objects may be measured using a magnetometer other than those of the array of magnetometers $M_{ij}$.

The recognition of the magnetic object may be carried out using only one of the distinctive features or using only a portion of the distinctive features previously described. For example, only the amplitude $As_m$ or the relative distance $Ds_m$ is used.

The distinctive feature may also be different from those described. For example, this distinctive feature may be the relative amplitude between the magnetic dipoles. Indeed, like the other distinctive features, this distinctive feature does not depend on the position and orientation of the magnetic object.

It is not necessary that the relative distances, relative orientations and amplitudes of the magnetic moments or the number of magnetic dipoles are all constant over time. If one of the distinctive features of the magnetic object varies over time, the signature of this object only comprises the distinctive features of the object 4 that do not vary over time and only these distinctive features that are invariable over time are used for the recognition of this object. For example, the amplitude of one of the magnetic moments may vary over time between a state in which the object 4 is powered or switched on, and a state in which the object 4 is switched off or not powered. In this case, for recognizing this magnetic object, only the relative distance or the relative orientation of the magnetic moments of the magnetic dipoles is used. In the latter case, another solution consists in recording in the database 36 a first magnetic signature of the object when it is switched on and a second signature when it is switched off. Thus, in addition to recognizing the object, this may also indicate whether it is switched off or switched on.

The distinctive features may be calculated differently from what has been previously described. For example, the relative distance between two magnetic dipoles may be represented by the value of the shortest distance between the centers of these two magnetic dipoles rather than the distances $d_{10}$ and $d_{12}$.

In operation 88, the results obtained with the first model $M_P$ used for which the error $E_P$ is below a predetermined threshold may be selected.

The estimation algorithm used for solving the system of equations linking the magnetometer measurements to the positions, orientations and amplitudes of the dipoles of the magnetic object may be other than an extended Kalman filter. For example, it may involve the LMA algorithm ('Levenberg-Marquard Algorithm'). In the case of estimation algorithms other than Kalman filters, the error $E_P$ may be calculated differently. In this case, operation 80 is replaced by operations 82 and 84 (represented by dashed lines in FIG. 5).

In operation 82, the unit 30 solves the direct model of the model $M_P$ used in operation 78. In other words, in this operation, the variables of the system of equations the value whereof is known are the variables representing the location and amplitude of the magnetic dipoles and the variables whereof the values are unknown are those representing the measurements of each of the magnetometers $M_{ij}$.

In operation 84, the unit 30 calculates the difference between the measurement estimated in operation 82 and the measurement taken in step 74. The absolute value of this difference constitutes the error E.

Many other methods of comparing the measured distinctive features with the prerecorded magnetic signatures are possible. For example, the unit 30 calculates the difference between the measured and prerecorded distinctive features for each magnetic signature and then it is considered that the object to be recognized is the known object for which this difference is the smallest.

In step 108, the results from identifying the known object corresponding to the object to be recognized may be filtered differently from what has been described or omitted. In the case where filtering is omitted, the queue is omitted and the number Q of repetitions is equal to one for example. This notably enables the method of recognition to be speeded up. For example, the latter embodiment is preferred when the accuracy of the magnetometers is sufficient to enable a correct recognition at each iteration of step 80.

The selection of the model displaying the minimum error $E_P$ may also be omitted. For example, in one particular embodiment, a single model $M_P$ is systematically used. This can be used to simplify the recognition apparatus in the case where it is known in advance that all the objects to be recognized all have a constant number P of magnetic dipoles.

A magnetic dipole may be created by something other than a permanent magnet. For example, a magnetic dipole may be created by the interaction between the Earth's magnetic field and a component of the object to be recognized made of soft magnetic material. A magnetic material is considered soft if its coercive magnetic field is less than 10 or 1 $A \cdot m^{-1}$.

The permanent magnets of the object to be recognized may participate in the operation of this object. This is, for example, the case when the permanent magnets are the permanent magnets of the loudspeaker and microphone. However, as a variant, the permanent magnets may be added to the object to be recognized in order to enable the recognition thereof by the apparatus 6. For example, permanent magnets are added to a pencil and an eraser at different locations on each of these than five.

The invention claimed is:

1. A method for automatic recognition of a mobile magnetic object presented in front of an array of magnetometers having N triaxial magnetometers mechanically connected to each other without any degree of freedom for maintaining a known distance between each of these magnetometers, where N is an integer greater than or equal to five, said method comprising
   a) when the magnetic object is presented in front of the array of magnetometers, causing each of the magnetometers to measure the amplitude of the magnetic field along each of the measurement axes thereof,
   b) determining, from the magnetometer measurements, the positions, orientations and amplitudes of the magnetic moments of P magnetic dipoles, where P is an integer greater than or equal to one and less than or equal to N/2, wherein determining comprises solving a predetermined system of equations linking each measurement of a triaxial magnetometer of the array to the positions, orientations, and amplitudes of the magnetic moments of P distinct magnetic dipoles,
   c) calculating an error representative of the difference between: an estimate of the values of the magnetometer measurements when the positions, orientations and amplitudes of the magnetic moments of the P dipoles are equal to those determined in step b), and the values of the magnetometer measurements taken in step a),
   d) selecting another system of equations linking each measurement of a triaxial magnetometer to the position, orientation and amplitude of the magnetic moment of P' magnetic dipoles, where P' is a natural integer different from P, then the repetition of steps b) and c) with the other system of equations,
   e) automatically selecting the system of equations that minimizes the error calculated in step c) and calculating at least one distinctive feature of the object presented from the position or orientation or amplitude of the magnetic moment of each dipole determined in step b) with the automatically selected system of equations that minimizes the error calculated in step c),
   wherein the distinctive feature is selected from a first group, if the number of magnetic dipoles in the system of equations that minimizes the error calculated in step c) is strictly greater than one,
   wherein the distinctive feature is selected from a second group otherwise,
   wherein the first group consists of the relative position of the P magnetic dipoles with respect to each other, the orientation of the magnetic moments of the P magnetic dipoles with respect to each other, the amplitudes of the magnetic moments of the P dipoles or the relative amplitudes of the magnetic moments of the P magnetic dipoles with respect to each other, and the number of magnetic dipoles identified in the magnetic object presented, and
   wherein the second group consists of: the amplitude of the magnetic moment of the dipole, and the number of magnetic dipoles identified in the magnetic object presented,
   f) comparing each distinctive feature calculated in step e) with a corresponding prerecorded distinctive feature for a known object, and g) recognizing the magnetic object presented if the calculated distinctive features correspond to those of the known object, otherwise recognizing the lack of recognition of the object.

2. The method as claimed in claim 1, wherein the number P of magnetic dipoles is systematically strictly greater than one.

3. The method as claimed in claim 1, wherein solving the system of equations comprises implementing an estimation algorithm capable of solving a nonlinear system of equations.

4. A manufacture comprising a tangible and non-transitory computer-readable medium having encoded thereon instructions that, when executed by an electronic computer, implement steps c) through g) of the method of claim 1.

5. An apparatus for automatic recognition of a mobile magnetic object, said apparatus comprising:—
(a) an array of magnetometers, said array comprising N triaxial magnetometers mechanically connected to each other without any degree of freedom for maintaining a known distance between each of these magnetometers, where N is an integer greater than or equal to five, and
—an electronic computer programmed for:
b) determining, from the magnetometer measurements, the positions, orientations and amplitudes of the magnetic moments of P magnetic dipoles, where P is an integer greater than or equal to one and less than or equal to N/2 by solving a predetermined system of equations linking each measurement of a triaxial magnetometer of the array to the positions, orientations and amplitudes of the magnetic moments of P distinct magnetic dipoles,
c) calculating an error representative of the difference between:
an estimate of the values of the magnetometer measurements when the positions, orientations and amplitudes of the magnetic moments of the P dipoles are equal to those determined in step b), and
the values of the magnetometer measurements used in step b),
d) selecting another system of equations linking each measurement of a triaxial magnetometer to the position, orientation and amplitude of the magnetic moment of P' magnetic dipoles, where P' is a natural integer different from P, then repeating steps b) and c) with the other system of equations,
e) automatically selecting the system of equations that minimizes the error calculated in step c) and calculating at least one distinctive feature of the object presented from the position or orientation or amplitude of the magnetic moment of each dipole determined in step b) with the system of equations that minimizes the error calculated in step c),
wherein the distinctive feature is selected from a first group
if the number of magnetic dipoles in the system of equations that minimizes the error calculated in step c) is strictly greater than one and wherein the distinctive feature is selected from a second group otherwise
wherein the first group consists of
the relative position of the P magnetic dipoles with respect to each other, the orientation of the magnetic moments of the P magnetic dipoles with respect to each other,
the amplitudes of the magnetic moments of the P dipoles or the relative amplitudes of the magnetic moments of the P magnetic dipoles with respect to each other, and
the number of magnetic dipoles identified in the magnetic object presented,
and wherein the second group consists of
the amplitude of the magnetic moment of the dipole, and
the number of magnetic dipoles identified in the magnetic object presented,
f) comparing each distinctive feature calculated in step e) with a corresponding prerecorded distinctive feature for a known object, and
g) recognizing the magnetic object presented if the calculated distinctive features correspond to those of the known object, and otherwise reporting a failure to recognize the object.

6. The apparatus of claim 5, wherein said mobile magnetic object comprises a plurality of permanent magnets having different powers, and wherein the ratio between the power of the strongest permanent magnet of the object and the power of the weakest permanent magnet of the object is less than five.

7. The method of claim 1, wherein repetition of steps b) and c) with the other system of equations is carried out using the same magnetic measurements as the ones used for the previous iteration of steps b) and c).

* * * * *